United States Patent
Prejbeanu et al.

(10) Patent No.: US 9,336,846 B2
(45) Date of Patent: May 10, 2016

(54) MRAM ELEMENT WITH LOW WRITING TEMPERATURE

(71) Applicant: CROCUS Technology SA, Grenoble (FR)

(72) Inventors: Ioan Lucian Prejbeanu, Seyssinet Pariset (FR); Jerome Moritz, St-Pierre-de-Bressieux (FR); Bernard Dieny, Lans-en-Vercors (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 14/762,264

(22) PCT Filed: Jan. 16, 2014

(86) PCT No.: PCT/EP2014/050772
§ 371 (c)(1),
(2) Date: Jul. 21, 2015

(87) PCT Pub. No.: WO2014/114550
PCT Pub. Date: Jul. 31, 2014

(65) Prior Publication Data
US 2015/0357014 A1     Dec. 10, 2015

(30) Foreign Application Priority Data
Jan. 23, 2013 (EP) .................................. 13290019

(51) Int. Cl.
*G11C 11/16* (2006.01)
*H01L 43/02* (2006.01)
(Continued)

(52) U.S. Cl.
CPC .............. *G11C 11/161* (2013.01); *G11C 11/16* (2013.01); *G11C 11/1675* (2013.01); *H01L 43/02* (2013.01); *H01L 43/08* (2013.01); *H01L 43/10* (2013.01); *G11C 2211/5615* (2013.01)

(58) Field of Classification Search
CPC ........................ G11C 11/16; G11C 2211/5615
USPC ........................................................ 365/158
See application file for complete search history.

(56) References Cited

U.S. PATENT DOCUMENTS 6,819,586 B1    11/2004  Anthony
7,525,776 B2 *   4/2009  Fukuzawa .............. B82Y 25/00
                                                      360/324.11
(Continued)

FOREIGN PATENT DOCUMENTS

WO         03/043017  A2     5/2003

OTHER PUBLICATIONS

International Search Report for PCT/EP2014/050772 dated Apr. 10, 2014.
(Continued)

*Primary Examiner* — Hoai V Ho
*Assistant Examiner* — Roberto Mancera
(74) *Attorney, Agent, or Firm* — Pearne & Gordon LLP

(57) ABSTRACT

MRAM element having a magnetic tunnel junction including a reference layer, a storage layer, a tunnel barrier layer between the reference and storage layers, and a storage antiferromagnetic layer. The storage antiferromagnetic layer has a first function of exchange-coupling a storage magnetization of the storage layer and a second function of heating the magnetic tunnel junction when a heating current in passed in the magnetic tunnel junction. The MRAM element has better data retention and low writing temperature.

12 Claims, 4 Drawing Sheets

(51) Int. Cl.
*H01L 43/08* (2006.01)
*H01L 43/10* (2006.01)

(56) References Cited

U.S. PATENT DOCUMENTS 7,643,332 B2 * 1/2010 Leuschner ............. G11C 11/15
365/148
8,503,225 B2 * 8/2013 Lombard ............. G11C 11/161
365/148

2007/0189064 A1 8/2007 Min
2012/0119313 A1 5/2012 Zheng

OTHER PUBLICATIONS

Lang, et al., "Dependence of the Blocking Temperature in Exchange Biased Ferromagnetic/antiferromagnetic Bilayers on the Thickness of the Antiferromagnetic Layer", Nanotechnology, IOP, Bristol, GB, vol. 18, No. 15. 18 Apr. 2007, p. 155701.

* cited by examiner

MRAM ELEMENT WITH LOW WRITING TEMPERATURE

The present disclosure concerns a thermally assisted switching magnetic random access memory (MRAM) element having better data retention and low writing mode operating temperature.

DESCRIPTION OF RELATED ART

Thermally-assisted MRAM elements are known. A MRAM element typically comprises a magnetic tunnel junction including a reference layer having a reference magnetization; a storage layer having a storage magnetization; a tunnel barrier layer included between the storage layer and the reference layer; and a storage antiferromagnetic layer exchange-coupling the storage layer such as to pin the storage magnetization at a low temperature threshold and to free it at a high temperature threshold. Pinning of the storage magnetization is usually due to an exchange bias provided by the exchange-coupling at the low temperature threshold.

For small MRAM element, typically its size is decreased below 100 nm, the exchange bias provided by the storage antiferromagnetic layer at the low temperature threshold can become instable. The instability is related to grain size distributions of the antiferromagnetic layer, characteristic of manganese based alloys comprised in the antiferromagnetic layer.

Moreover, reliability of the MRAM element can be further impaired when such MRAM element is used in high temperature applications. Indeed, the heating voltage needed to free the storage magnetization can get close to the breakdown voltage of the magnetic tunnel junction.

SUMMARY

The present disclosure concerns a MRAM element having a magnetic tunnel junction comprising: a reference layer having a fixed reference magnetization; a storage layer having a storage magnetization; a tunnel barrier layer between the storage layer and the reference layer; and a storage antiferromagnetic layer; the MRAM element further comprising a current line in electrical contact with one end of the magnetic tunnel junction and arranged for passing a heating current in the magnetic tunnel junction for heating the magnetic tunnel junction; wherein the storage antiferromagnetic layer having a first function of pinning the storage magnetization when the magnetic tunnel junction is at a low threshold temperature and freeing the storage magnetization when the magnetic tunnel junction is heated at a high threshold temperature; and wherein the storage antiferromagnetic layer further having an electrical resistivity comprised between about 1 mΩ-cm and 3000 mΩ-cm such that the storage antiferromagnetic layer has a second function of heating the magnetic tunnel junction when the heating current is passed in the magnetic tunnel junction via the current line.

The storage antiferromagnetic layer further comprises at least one metallic element such as to vary the electrical resistivity of the storage antiferromagnetic layer, said at least one metallic element comprising one or a plurality of metallic layers included in the storage antiferromagnetic layer.

In an embodiment, the storage antiferromagnetic layer comprises an oxide. The oxide can comprise a CoO oxide or a NiO oxide or an oxide comprising Co and/or Ni. The oxide can further comprise a CoNiO oxide.

In another embodiment, the storage antiferromagnetic layer can further comprise at least one metallic element such as to vary the electrical resistivity of the storage antiferromagnetic layer. The metallic element can comprise at least one of copper, tantalum or ruthenium.

In yet another embodiment, pinning and freeing of the storage magnetization can be obtained via exchange bias between the storage antiferromagnetic layer and the storage layer, or by increased coercivity of the storage layer by the storage antiferromagnetic layer.

The present disclosure further pertains to a method for writing the MRAM element. comprising:

heating the magnetic tunnel junction at or above the critical temperature;

once the storage antiferromagnetic layer has reached the critical temperature, switching the storage magnetization in a written state;

cooling the magnetic tunnel junction to a temperature being below the critical temperature such as to pin the storage magnetization in the written state.

The disclosed MRAM element has better data retention and low writing temperature.

BRIEF DESCRIPTION OF THE DRAWINGS

The disclosure will be better understood with the aid of the description of an embodiment given by way of example and illustrated by the figures, in which.

DETAILED DESCRIPTION OF POSSIBLE EMBODIMENTS

Figure 1:
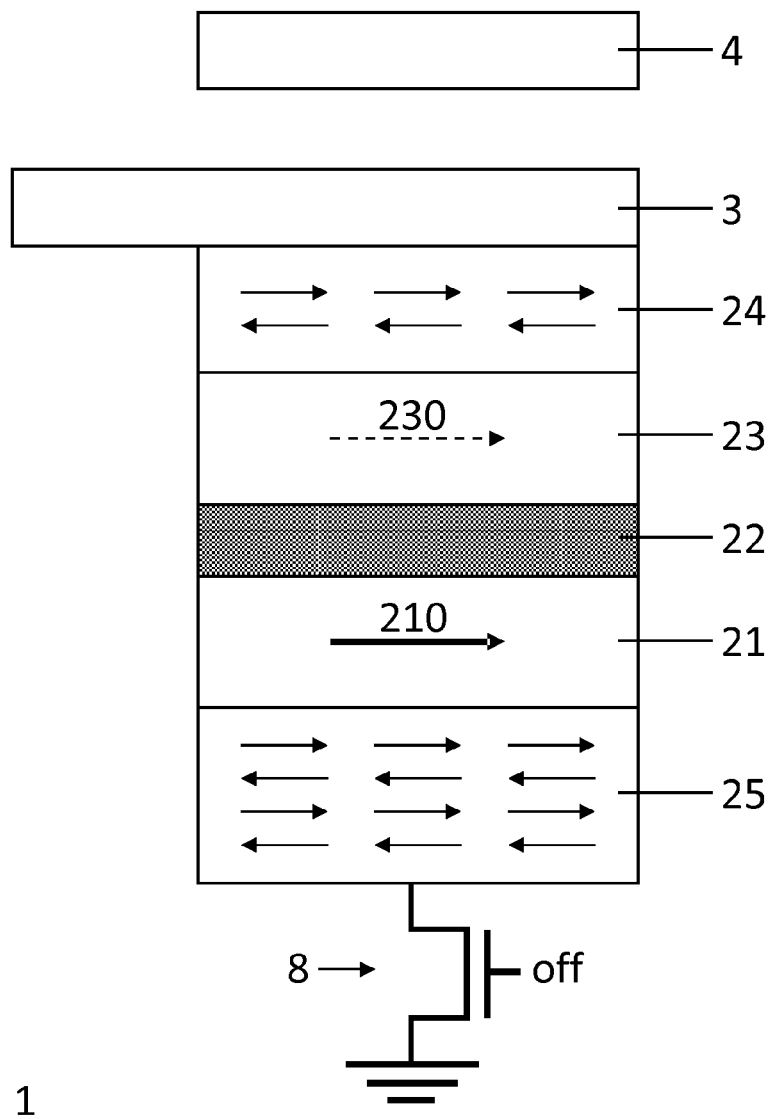
FIG. 1 shows a view a MRAM element according to an embodiment.

FIG. 1 shows a MRAM element 1 comprising a magnetic tunnel junction 2 according to an embodiment. The magnetic tunnel junction 2 comprises a reference layer 21 having a fixed reference magnetization 210, a storage layer 23 having a storage magnetization 230, and a tunnel barrier layer 22 comprised between the sense and the storage layers 21, 23. The tunnel barrier layer 22 is a thin layer, typically in the nanometer range and can be formed, for example, from any suitable insulating material, such as alumina or magnesium oxide. Typically, the tunnel barrier layer 22 has an electrical resistivity comprised between about 1 mΩ-cm and 3000 mΩ-cm.

The magnetic tunnel junction 2 further comprises a storage antiferromagnetic layer exchange-coupling the storage layer 23 such as to pin the storage magnetization 230 when the magnetic tunnel junction 2 is at a low temperature threshold, below a critical temperature of the antiferromagnetic layer 24 and free the storage magnetization 230 when the magnetic tunnel junction 2 is heated at a high temperature threshold, at and above the critical temperature.

The storage antiferromagnetic layer 24 further has an electrical resistivity that is the same order of magnitude than the electrical resistivity of tunnel barrier layer 22. For example, the storage antiferromagnetic layer 24 has an electrical resistivity that is comprised between about 1 mΩ-cm and 3000 mΩ-cm. Such storage antiferromagnetic layer 24 is thus further adapted for heating the magnetic tunnel junction 2 when the heating current 31 is passed in the magnetic tunnel junction 2 via the current line 3.

Figure 5:
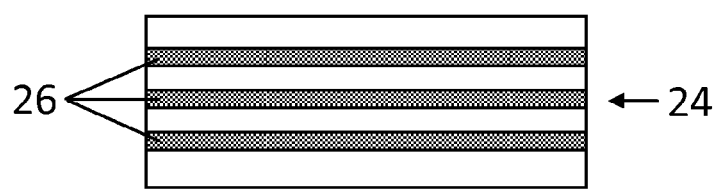
FIG. 5 represents a storage antiferromagnetic layer of the MRAM element, according to an embodiment.

In an embodiment, the storage antiferromagnetic layer 24 comprises an oxide such as a CoO-based oxide or a NiO-based oxide or an oxide comprising Co and/or Ni. In a preferred embodiment, the oxide comprises CoNiO. The CoNiO-based storage antiferromagnetic layer 24 advantageously combines the high magnetocrystalline anisotropy of the CoO and the high blocking temperature of the NiO. The oxide storage antiferromagnetic layer 24 allows for obtaining the electrical resistivity being comprised between about 1 mΩ-cm and 3000 mΩ-cm. The electrical resistivity of the storage antiferromagnetic layer 24 can be further adjusted by adding at least one metallic element to the storage antiferromagnetic layer 24. Preferably, the added metallic element can comprise at least one of copper, tantalum or ruthenium. In an embodiment, the added metallic element comprises one or a plurality of metallic layers 26 included (for example inserted) in the storage antiferromagnetic layer 24. FIG. 5 represents the storage antiferromagnetic layer 24 in isolation from the rest of the magnetic tunnel junction 2 and comprising the metallic layers 26. Each metallic layer 26 can have a thickness smaller than 0.5 nm. Each metallic layer 26 can further comprise at least one of copper, tantalum or ruthenium. The one or plurality of metallic elements can be comprised in the storage antiferromagnetic layer 24 in any other ways including in the form of islands of the metallic element within the antiferromagnetic material or mixed homogeneously with the antiferromagnetic material.

The magnetic tunnel junction 2 can further comprise a reference antiferromagnetic layer 25 exchange-coupling the reference layer 21. The reference antiferromagnetic layer 24 can comprise PtMn, IrMn, or any other suitable materials such as to pin the reference magnetization 210 when the magnetic tunnel junction 2 is at the low and high temperature threshold.

The MRAM element 1 further comprises a current line 3 in electrical contact with one end of the magnetic tunnel junction 2. The current line 3 is adapted for passing a heating current 31 in the magnetic tunnel junction 2 via the current line 3 for heating the magnetic tunnel junction 2.

A method for writing the MRAM element 1 is illustrated in FIGS. 2a to 2d, according to an embodiment and comprising the steps of:

heating the magnetic tunnel junction 2 at or above the critical temperature;

once the storage antiferromagnetic layer 24 has reached the critical temperature, switching the storage magnetization 230 in a written state;

cooling the magnetic tunnel junction 2 to a temperature being below the critical temperature such as to pin the storage magnetization 230 in the written state.

Figures 2A, 2B:
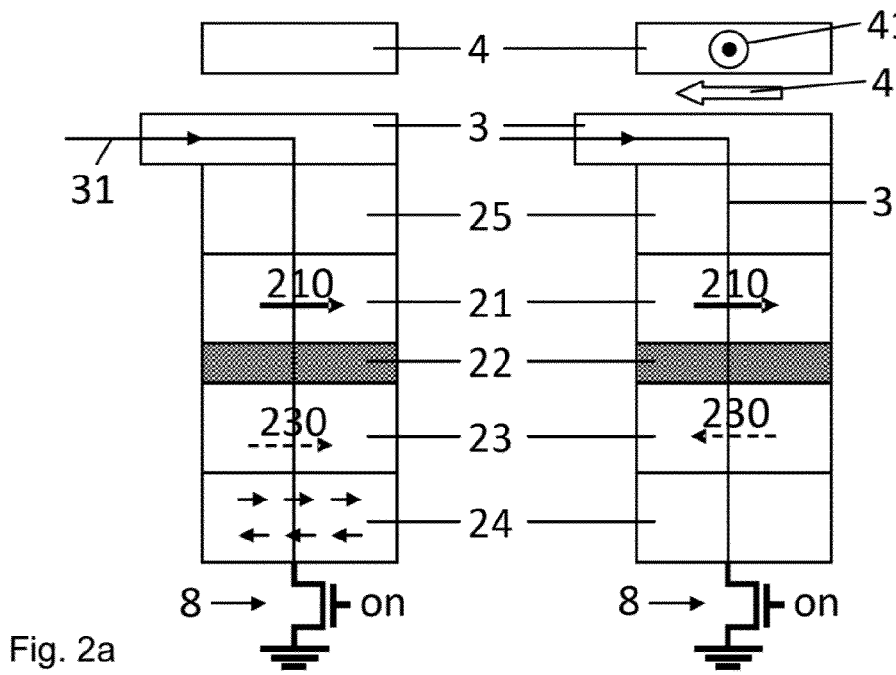
FIGS. 2(a) to (d) illustrate a method for writing the MRAM element, according to an embodiment.

In particular, heating the magnetic tunnel junction 2 by passing the heating current 31 in the magnetic tunnel junction 2 via the current line 3 is shown in FIG. 2a. As shown in the figure, the MRAM element 1 comprises a select transistor 8 electrically connected to the other end of the magnetic tunnel junction 2. The select transistor 8 can be put in a passing mode (ON) allowing the heating current 31 to pass in the magnetic tunnel junction 2.

FIG. 2b represents switching the storage magnetization 230 by applying a write magnetic field 42. More particularly, the write magnetic field 42 is generated by passing a field current 41 in a field line 4 represented on top of the current line 3 in the examples of FIGS. 2a to 2d. Other arrangements are also possible. For example, the field line 4 can be placed at the other end of the magnetic tunnel junction 2. Alternatively, the filed current 41 can be passed in the current line 3, avoiding the extra field line 4. As shown in FIGS. 2a and 2b, the storage magnetization 230 is switched form an initial orientation substantially parallel to the reference magnetization 210 (FIG. 2a) to a switched orientation substantially antiparallel to the reference magnetization 210 (FIG. 2b).

Figures 2C, 2D:
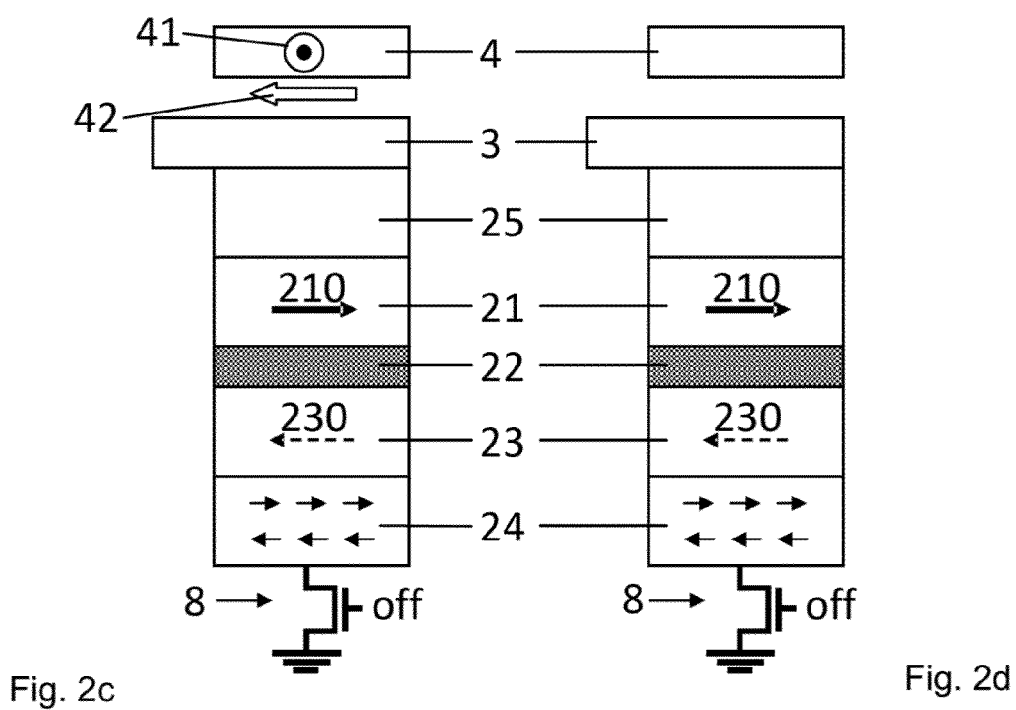

The heating current 31 is then turned off, for example by setting the select transistor 8 in a closed mode (OFF), such as to cool down the magnetic tunnel junction 2 below the critical temperature. During the cooling step, the write magnetic field can be applied as represented in FIG. 2c. Once the magnetic tunnel junction is below the critical temperature such that the storage magnetization 230 is pinned in the written state, the write magnetic field 42 can be removed (FIG. 2d).

During the writing of the MRAM element 1, the storage antiferromagnetic layer 24, having an electrical resistivity being on the same order of magnitude as the one of the tunnel barrier layer 22 will thus function as a heating element when the heating current 31 is passed in the magnetic tunnel junction 2. An advantage of the storage antiferromagnetic layer 24 functioning as heating element is that the heating is local, i.e., is produced in the vicinity of the storage layer 23. This results in improved heating efficacy and improved reliability of the MRAM element 1 as the voltage due to the passage of the heating current 31 is shared between the tunnel barrier layer 22 and the antiferromagnetic oxide layer 24.

During the writing of the MRAM element 1, the storage antiferromagnetic layer 24 further provides the exchange-coupling between the storage antiferromagnetic layer 24 and the storage layer 23 as disclosed above.

The resistance R across the MRAM element 1, and thus data state, is determined by the orientation of the storage magnetization 230 relative to the reference magnetization 210. The reference magnetization 210 is pinned in a predetermined direction while the direction of the storage magnetization 230 can be switched as described above.

During a read operation, a read current 32 can be passed in the magnetic tunnel junction 2 via the current line 3 such as to measure the resistance R across the MRAM element 1. A low resistance value (data state "0") is measured when the storage magnetization 230 is substantially parallel to the reference magnetization 210. Conversely, a high resistance value (data state "1") is measured when the storage magnetization 230 is substantially antiparallel to the reference magnetization 210.

Figure 3A:
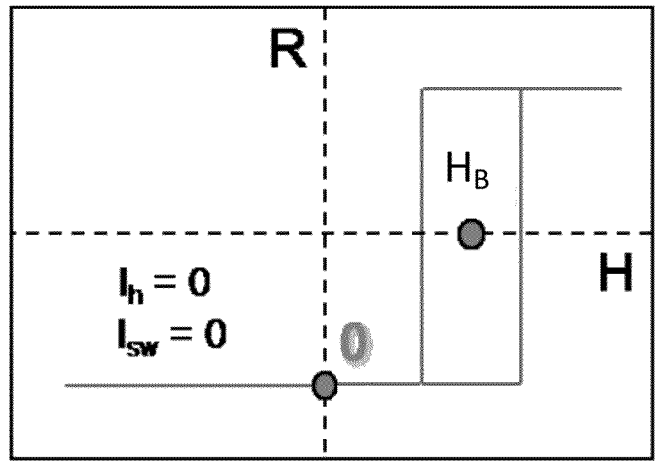
FIGS. 3(a) to (c) show magnetization curves for the MRAM element, according to an embodiment.
Figure 3B:
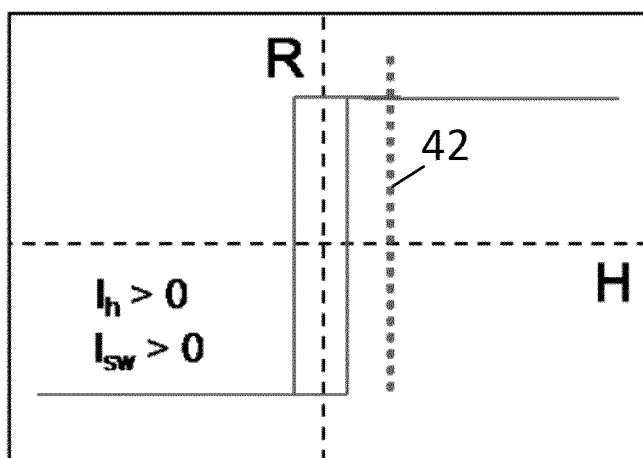
Figure 3C:
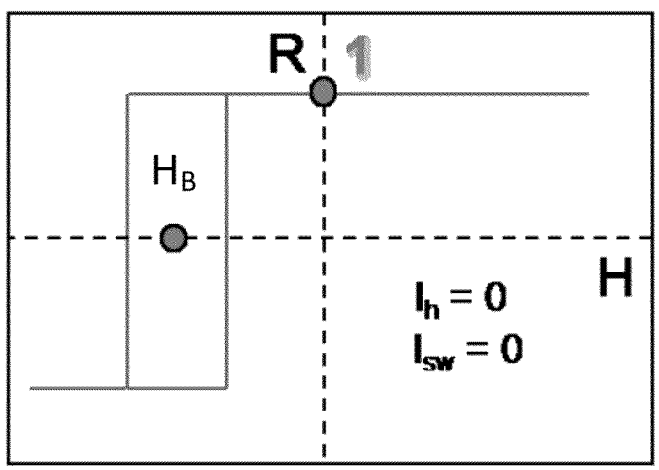
Figure 4A:
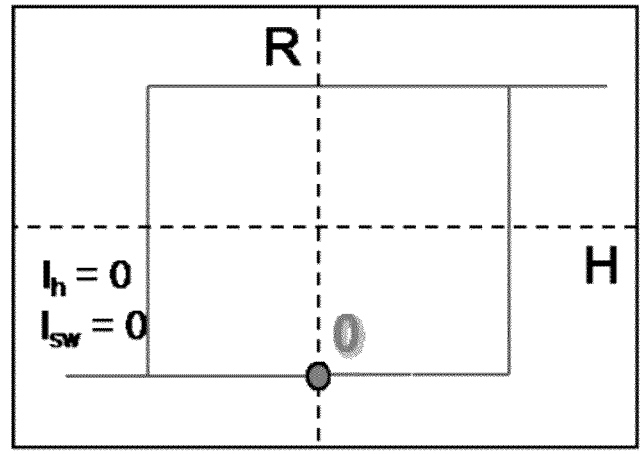
FIGS. 4(a) to (c) show magnetization curves for the MRAM element, according to another embodiment.
Figure 4B:
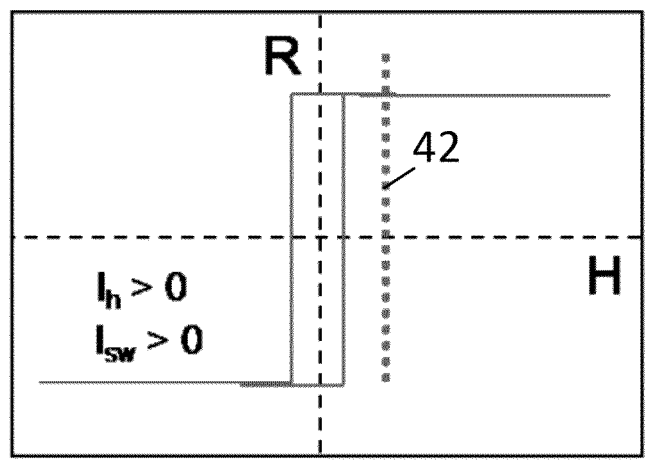
Figure 4C:
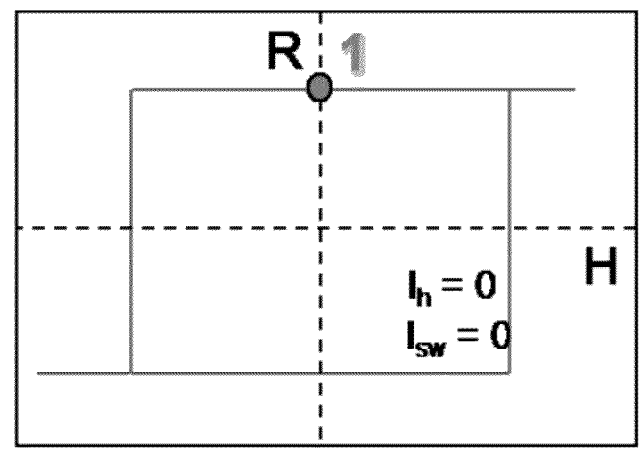

FIGS. 3 and 4 show hysteresis loops, or magnetization curves, for the MRAM element 1 in the respective configurations of FIGS. 1, 2b and 2d, wherein change in the resistance R of the MRAM element 1 is plotted as a function of the magnetic field H.

In particular, FIG. 3 (a) to (c) correspond to the case where the exchange-coupling between the storage layer 23 and the storage antiferromagnetic layer 24 provides an exchange bias $H_B$ causing a shift in the magnetization curve of the storage layer 23 in proportion with the exchange bias $H_B$. FIG. 3(a) illustrates the case where the storage magnetization 230 is parallel to the reference magnetization (see FIG. 2(a)) and the magnetization curve of the storage layer 23 is shifted in proportion with the exchange bias $H_B$, towards positive magnetic field values (towards the right on FIG. 3(a)). In the absence of the write magnetic field 42, the MRAM element 1 is in the data state "0".

When the magnetic tunnel junction 2 is heated at the high temperature threshold by passing the heating current 31 (FIG. 2(b)), the exchange coupling vanishes and there is no more exchange bias $H_B$. The magnetization curve is symmetric and centred around a null magnetic field (FIG. 3(b)). The write magnetic field 42 (represented by the dashed line) is applied with a magnitude corresponding to the saturation of the storage magnetization 230 such that the storage magnetization 230 can be switched from its initial orientation parallel to the reference magnetization 210 to a switched orientation antiparallel to the reference magnetization 210. The magnetization curve with the storage magnetization 230 in the switched orientation is shown in FIG. 3(*c*) being shifted towards negative magnetic field values (towards the left on FIG. 3(*c*)) in proportion with the exchange bias $H_B$ yielding data state "0" in the absence of the write magnetic field 42.

The magnetization curves in the FIGS. 3 (*a*) to (*c*) correspond to the case where the storage antiferromagnetic layer 24 comprises relatively large grain sizes typically larger than 10 nm or/and where the storage layer 23 and the storage antiferromagnetic layer 24 have been grown in a magnetic field or after growth is annealed in a magnetic field to temperatures above Néel temperature of the storage antiferromagnetic layer 24. The exchange bias $H_B$ reflects the fact that there is a preferred easy magnetization direction for the storage layer 23; the storage magnetization 230 being pinned by the storage antiferromagnetic layer 24 into this direction.

In contrast, magnetization curves shown in FIGS. 4(*a*) to (*c*) correspond to the case where the exchange-coupling between the storage layer 23 and the storage antiferromagnetic layer 24 increases the coercivity of the storage layer 23 at the low temperature threshold. Here, the increased coercivity is larger than the exchange bias field $H_B$. This case happens when the storage antiferromagnetic layer 24 comprises relatively small grain sizes typically smaller than 10 nm. Furthermore, when storage layer 23 is simply grown on top of the storage antiferromagnetic layer 24 the exchange-coupling between the two layers 23, 24 only leads to an increased coercivity of the storage layer 23 as shown in FIG. 4(*a*) representing the initial data state "0" wherein the storage magnetization 230 is oriented parallel to the reference magnetization 210. This is usually attributed to the increased coercivity of "interfacial spins" which exchange bias need to be dragged around by the write magnetic field 42. However, the magnetization curve is still symmetric, indicating two equivalent easy directions.

In FIG. 4(*b*), the magnetic tunnel junction 2 is heated at the high temperature threshold by passing the heating current 31 where the exchange-coupling between the storage antiferromagnetic layer 24 and the storage layer 23 vanishes. The magnetization curve shows smaller coercivity of the unpinned storage layer 23 such that the write magnetic field 42 can be applied with a small magnitude to switch the storage magnetization from its initial orientation parallel to the reference magnetization 210 to the switched orientation antiparallel to the reference magnetization 210. Once the magnetic tunnel junction 2 has been cooled down to the low temperature threshold the storage layer 23 is again exchange-coupled by the storage antiferromagnetic layer 24, increasing the coercivity of the storage layer 23. The magnetization curve remains symmetric (FIG. 4(*c*)).

REFERENCE NUMBERS AND SYMBOLS

1 MRAM element
2 magnetic tunnel junction
21 reference layer
210 reference magnetization
22 tunnel barrier layer
23 storage layer
230 storage magnetization
24 storage antiferromagnetic layer
25 reference antiferromagnetic layer
26 layer of metallic element
41 field current
42 write magnetic field
8 select transistor
H magnetic field
$H_B$ exchange bias
R resistance of the MRAM element

What is claimed is:

1. MRAM element having a magnetic tunnel junction comprising:
   a reference layer having a fixed reference magnetization;
   a storage layer having a storage magnetization;
   a tunnel barrier layer between the storage layer and the reference layer; and
   a storage antiferromagnetic layer;
   the MRAM element further comprising a current line in electrical contact with one end of the magnetic tunnel junction and arranged for passing a heating current in the magnetic tunnel junction for heating the magnetic tunnel junction; wherein
   the storage antiferromagnetic layer having a first function of pinning the storage magnetization when the magnetic tunnel junction is at a low threshold temperature and freeing the storage magnetization when the magnetic tunnel junction is heated at a high threshold temperature; and wherein
   the storage antiferromagnetic layer further having an electrical resistivity comprised between 1 mΩ-cm and 3000 mΩ-cm such that the storage antiferromagnetic layer has a second function of heating the magnetic tunnel junction when the heating current is passed in the magnetic tunnel junction via the current line, wherein the storage antiferromagnetic layer further comprises at least one metallic element such as to vary the electrical resistivity of the storage antiferromagnetic layer; said at least one metallic element comprises one or a plurality of metallic layers embedded in the storage antiferromagnetic layer.

2. The MRAM element according to claim 1, wherein the storage antiferromagnetic layer comprises an oxide.

3. The MRAM element according to claim 2, wherein the oxide comprises a CoO oxide or a NiO oxide or an oxide comprising Co and/or Ni.

4. The MRAM element according to claim 3, wherein the oxide comprises a CoNiO oxide.

5. The MRAM element according to claim 1, wherein said at least one metallic element comprises at least one of copper, tantalum or ruthenium.

6. The MRAM element according to claim 1, wherein each of said one or a plurality of metallic layers has a thicknesses smaller than 0.5 nm.

7. The MRAM element according to claim 1, wherein each of said one or a plurality of metallic layers further comprises at least one of copper, tantalum or ruthenium.

8. The MRAM element according to claim 1, wherein the storage antiferromagnetic layer is arranged such that said pinning and freeing of the storage magnetization is obtained via exchange bias between the storage antiferromagnetic layer and the storage layer.

9. The MRAM element according to claim 1, wherein the storage antiferromagnetic layer has grain size above 10 nm.

10. The MRAM element according to claim 1, wherein the storage antiferromagnetic layer is arranged such that said pinning and freeing of the storage magnetization is obtained via increased coercivity of the storage layer by the storage antiferromagnetic layer.

11. The MRAM element according to claim 1, wherein the storage antiferromagnetic layer has grain size below 10 nm.

12. A method for writing the MRAM element having a magnetic tunnel junction comprising a reference layer having a fixed reference magnetization, a storage layer having a storage magnetization, a tunnel barrier layer between the storage layer and the reference layer, and a storage antiferromagnetic layer having a first function of pinning the storage magnetization when the magnetic tunnel junction is at a low threshold temperature and freeing the storage magnetization when the magnetic tunnel junction is heated at a high threshold temperature;

the storage antiferromagnetic layer further having an electrical resistivity comprised between 1 mΩ-cm and 3000 mΩ-cm such that the storage antiferromagnetic layer has a second function of heating the magnetic tunnel junction when a heating current is passed in the magnetic tunnel junction;

the storage antiferromagnetic layer further comprising at least one metallic element such as to vary the electrical resistivity of the storage antiferromagnetic layer, said at least one metallic element comprising one or a plurality of metallic layers embedded in the storage antiferromagnetic layer; the method comprising:

heating the magnetic tunnel junction at or above the critical temperature;

once the storage antiferromagnetic layer has reached the critical temperature, switching the storage magnetization in a written state;

cooling the magnetic tunnel junction to a temperature being below the critical temperature such as to pin the storage magnetization in the written state.

* * * * *